(12) United States Patent
Yoo

(10) Patent No.: US 7,067,849 B2
(45) Date of Patent: Jun. 27, 2006

(54) DIODE HAVING HIGH BRIGHTNESS AND METHOD THEREOF

(75) Inventor: Myung Cheol Yoo, Pleasanton, CA (US)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/905,969

(22) Filed: Jul. 17, 2001

(65) Prior Publication Data
US 2003/0015713 A1 Jan. 23, 2003

(51) Int. Cl.
*H01L 33/00* (2006.01)
(52) U.S. Cl. .................... 257/102; 257/94; 257/96
(58) Field of Classification Search ............. 257/102, 257/103, 96, 94, 12, 13, 79, 97, 98, 82, 190, 257/191, 200, 91; 372/50, 45, 46
See application file for complete search history.

(56) References Cited

U.S. PATENT DOCUMENTS

| | | | |
|---|---|---|---|
| 5,798,537 A | 8/1998 | Nitta | |
| 5,880,486 A | 3/1999 | Nakamura et al. | |
| 5,939,735 A * | 8/1999 | Tsutsui et al. | 257/98 |
| 6,057,565 A * | 5/2000 | Yoshida et al. | 257/102 |
| 6,078,064 A | 6/2000 | Ming-Jiunn et al. | |
| 6,130,147 A | 10/2000 | Major et al. | |
| 6,185,238 B1 * | 2/2001 | Onomura et al. | 372/46 |
| 6,365,429 B1 * | 4/2002 | Kneissl et al. | 438/46 |
| 6,456,638 B1 * | 9/2002 | Fukunaga | 372/45 |
| 6,468,902 B1 * | 10/2002 | Kawai | 438/667 |
| 6,488,767 B1 * | 12/2002 | Xu et al. | 117/2 |
| 6,518,602 B1 * | 2/2003 | Yuasa et al. | 257/102 |
| 6,526,083 B1 * | 2/2003 | Kneissl et al. | 372/50 |
| 6,744,196 B1 * | 6/2004 | Jeon | 313/198 |
| 6,841,802 B1 * | 1/2005 | Yoo | 257/98 |
| 6,949,395 B1 * | 9/2005 | Yoo | 438/47 |
| 2002/0117672 A1 * | 8/2002 | Chu et al. | 257/79 |
| 2003/0015713 A1 * | 1/2003 | Yoo | 257/79 |
| 2003/0077847 A1 * | 4/2003 | Yoo | 438/22 |
| 2003/0080344 A1 * | 5/2003 | Yoo | 257/103 |
| 2003/0189212 A1 * | 10/2003 | Yoo | 257/79 |
| 2004/0169181 A1 * | 9/2004 | Yoo | 257/91 |
| 2004/0169189 A1 * | 9/2004 | Jeon | 257/98 |
| 2005/0093004 A1 * | 5/2005 | Yoo | 257/79 |
| 2006/0006400 A1 * | 1/2006 | Yoo | 257/94 |

OTHER PUBLICATIONS

Continuous-Wave Operation of InGaN Multiple-Quantum-Well Laser Diodes on Copper Substrates Obtained by Laser Liftoff, IEEE Journal on Selected Topics in Quantum Electronics, vol. 7, No. 2, Mar./Apr. 2001.
Continuous-Wave InGaN Multiple-Quantum-Well Laser Diodes on Copper Substrates, Physics Letters vol.78, no.9, Feb. 26, 2001.
The integration of $In_xGa_{1-x}N$ Multiple-Quantum-Well Laser Diodes with Copper Substrates by Laser Lift-Off, Jpn. J. Appl. Phys. vol. 39 (2000) pp. L 1203-L 1205, Part 2, No. 12A, Dec. 1, 2000.

* cited by examiner

*Primary Examiner*—Laura M. Schillinger
(74) *Attorney, Agent, or Firm*—McKenna Long & Aldridge LLP

(57) ABSTRACT

A light emitting diode includes a transparent substrate and a GaN buffer layer on the transparent substrate. An n-GaN layer is formed on the buffer layer. An active layer is formed on the n-GaN layer. A p-GaN layer is formed on the active layer. A p-electrode is formed on the p-GaN layer and an n-electrode is formed on the n-GaN layer. A reflective layer is formed on a second side of the transparent substrate. Also, a cladding layer of AlGaN is between the p-GaN layer and the active layer.

36 Claims, 9 Drawing Sheets

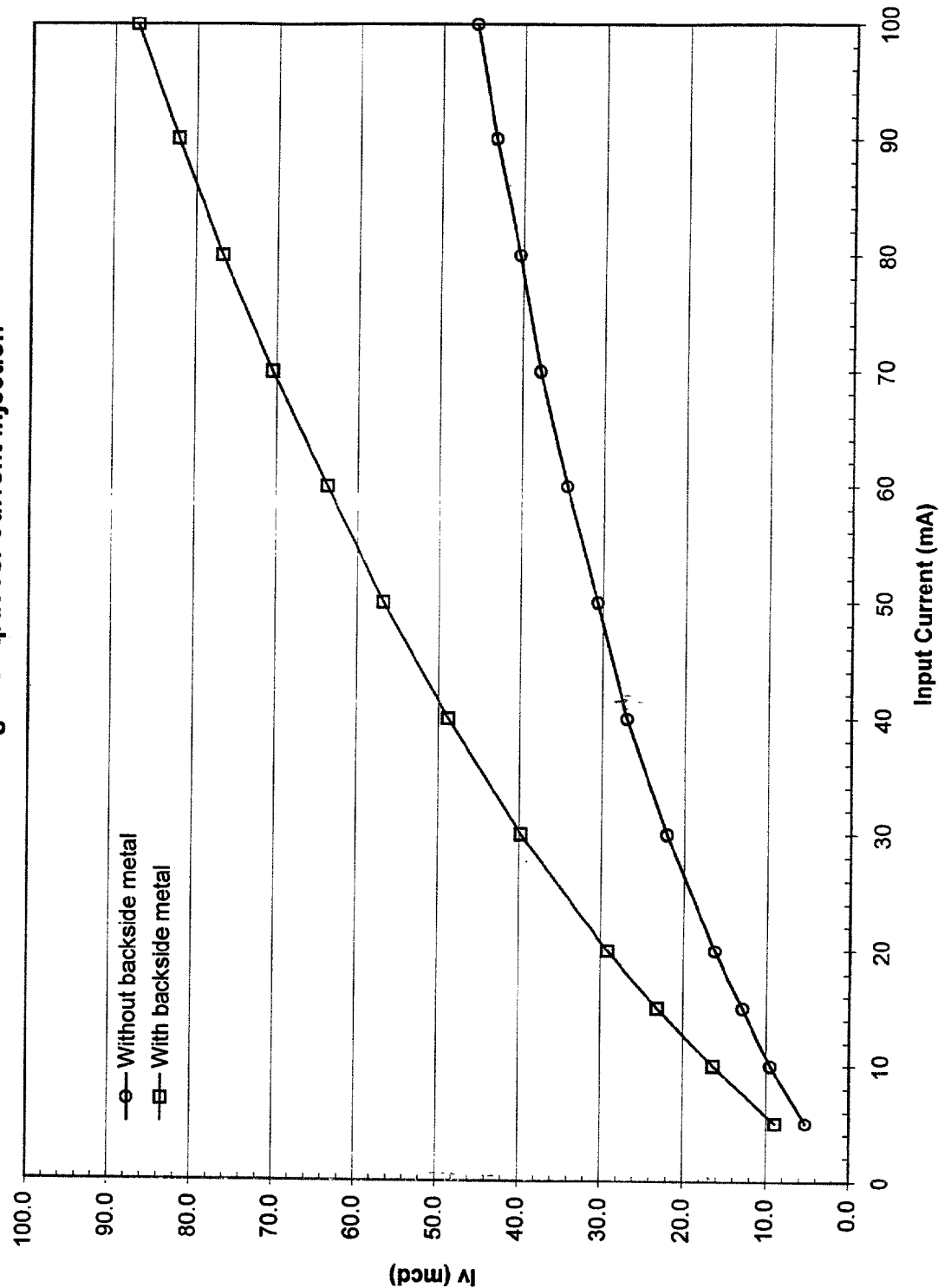

DIODE HAVING HIGH BRIGHTNESS AND METHOD THEREOF

BACKGROUND OF THE INVENTION

1. Field of the Invention

The present invention relates to diodes, and more particularly, to light emitting diodes (LEDs). Although the present invention is discussed with reference to light emitting diodes, the present invention can be used in a wide range of applications including, for example, other types of diodes such as laser diodes.

2. Discussion of the Related Art

Gallium-Nitride (GaN) based opto-electronic device technology has rapidly evolved from the realm of device research and development to commercial reality. Since they have been introduced in the market in 1994, GaN-based opto-electronic devices have been considered one of the most promising semiconductor devices. The efficiency of GaN light emitting diodes (LEDs), for example, has surpassed that of incandescent lighting, and is now comparable with that of fluorescent lighting.

The market growth for GaN based devices has been far exceeding than the industrial market prediction every year. In some applications, such as traffic lights and interior lighting in automobiles, the low maintenance cost and reduced power consumption of GaN LED's already outweigh the relatively high manufacturing costs. In other applications such as general room lighting, manufacturing costs are still much too high, and a simple economy of scale reveals that such devices are not yet the solution. Although considerably more demanding of materials quality and device design, room temperature, continuous wave blue lasers with reasonable lifetimes have been demonstrated. Their continued development combined with the potentially high-volume market should bring costs to acceptable levels, provided that they can be manufactured with high yield. GaN-based high-power electronic devices should also find application in mobile communications, another high-volume market. In order to expand the current AlInGaN-based LED market, it is crucial to develop low cost processing techniques without sacrificing device performances. Moreover, high power optical devices are strongly needed to replace the light bulb lamps. Accordingly, two important technical issues need to be solved at the same time, i.e., economical device production and high output power device fabrication.

Outdoor signboard display has been one of the primary markets since the introduction of blue LEDs. In such application, the light output is considered one of the most important device parameters in AlInGaN-based LEDs. As a result, the unit device price is approximately proportional to the light output intensity. Moreover, recently, the white LED application requires higher light output than currently available to replace the incandescent light bulbs for illumination. Therefore, developing a technology to increase light output is one of the most important tasks in the AlInGaN-based opto-electronic devices.

FIG. 1 shows a conventional light emitting diode structure. The conventional LED includes a substrate 10, such as sapphire. A buffer layer 12 made of, for example, gallium nitride (GaN) is formed on the substrate 10. An n-type GaN layer 14 is formed on the buffer layer 12. An active layer such as a multiple quantum well (MQW) layer 16 of AlInGaN, for example, is formed on the n-type GaN layer 14. A p-type GaN layer 18 is formed on the MQW layer 16.

The MQW layer emits photons "hv" in all directions to illuminate the LED. FIG. 1 shows directions 1, 2 and 3 for convenience. Photons traveling in directions 1 and 2 contribute to the intensity of the LED. However, photons traveling in direction 3 become absorbed by the substrate and the package which house the LED. This photon absorption decreases the light extraction efficiency resulting in reduced brightness of the LED.

There are two main methods to increase light output of the AlInGaN-based LEDs. The first method is to improve external quantum efficiency of the LED device by epitaxial growth and device structure design. This technique requires high quality epitaxial growth techniques that include MOCVD (Metal Organic Chemical Vapor Deposition), MBE (Molecular Beam Epitaxy), and HVPE (Hydride Vapor Phase Epitaxy) and sophisticated device design. In particular, MOCVD has been the most common growth tool to grow commercial grade AlInGaN-based LEDs. It is generally known that the epitaxial film quality is strongly dependent on the types of MOCVD growth method. Hence, in the manufacturing point of view, it is more difficult to improve optical light output of the LED devices by such growth technique.

Another method to enhance the optical light output is increasing the light extraction efficiency by optimizing the LED chip design. Compared to the method of increasing external quantum efficiency by epitaxial growth and device structure design, this method is much simpler and easier to increase the light intensity of the LED device. There have been many attempts to design the most efficient device design. However, thus far, these attempts have not led to the level of efficiency and brightness desired from the diode. Moreover, existing designs require high manufacturing cost. Accordingly, a diode is needed that has high brightness capability, an efficient design and low manufacturing cost.

SUMMARY OF THE INVENTION

Accordingly, the present invention is directed to a diode that substantially obviates one or more of the problems due to limitations and disadvantages of the related art.

An advantage of the present invention is providing a diode having high brightness.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a light emitting diode comprises a transparent substrate; a buffer layer on a first surface of the transparent substrate; an n-GaN layer on the buffer layer; an active layer on the n-GaN layer; a p-GaN layer on the active layer; a p-electrode on the p-GaN layer; an n-electrode on the n-GaN layer; and a reflective layer on a second side of the transparent substrate.

In another aspect, a method of making a light emitting diode having a transparent substrate and a buffer layer on a first surface of the transparent substrate comprises forming an n-GaN layer on the buffer layer; forming an active layer on the n-GaN layer; forming a p-GaN layer on the active layer; forming a p-electrode on the p-GaN layer; forming an n-electrode on the n-GaN layer; and forming a reflective layer on a second side of the transparent substrate.

In another aspect, a method of making a light emitting diode having a transparent substrate and a buffer layer on a first surface of the transparent substrate comprises forming an n-GaN layer on the buffer layer; forming an active layer on the n-GaN layer; forming a p-GaN layer on the active layer; forming a p-electrode on the p-GaN layer; forming an n-electrode on the n-GaN layer; and forming a reflective layer on a second side of the transparent substrate.

In another aspect, a method of making a light emitting diode having a substrate comprises forming an n-type layer and a p-type layer on the substrate; forming an active layer between the n-type layer and the p-type layer; forming a first electrode contacting the p-type layer; forming a second electrode contacting the n-type layer; and forming a reflective layer on the substrate.

In another aspect, a diode comprises a transparent substrate; an active layer on the transparent substrate, the active layer generating photons; and a reflective layer on the transparent substrate to reflect the photons from the active layer.

In another aspect, a method of making a diode comprises forming an active layer over a transparent substrate, the active layer generating photons; and forming a reflective layer on the transparent substrate to reflect the photons from the active layer.

In another aspect, a method of making a light emitting diode having a transparent substrate comprises forming an n-GaN layer having a first doping concentration on a first side of the transparent substrate; forming an InGaN active layer on the n-GaN layer, the active layer having an In concentration in a first range; forming a p-GaN layer having a second doping concentration on the InGaN active layer; forming a p-type contact layer on the p-GaN layer; forming an n-type contact layer on the n-GaN layer by etching the p-type contact layer, p-GaN layer and the InGaN active layer; reducing a thickness of the transparent substrate by backside lapping at a second surface of the transparent substrate; reducing a surface roughness of the transparent substrate; and forming a reflective layer on a reduced surface of the transparent substrate.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings:

FIG. 6 is a graph showing a relationship between light output and current injection for an LED having a reflective layer of the present invention and an LED without a reflective layer.

DETAILED DESCRIPTION OF THE INVENTION

Reference will now be made in detail to the present invention, examples of which are illustrated in the accompanying drawings.

In order to fabricate GaN-based light emitting diodes (LEDs), sapphire substrate has been generally used since sapphire is very stable and relatively cheaper. The epitaxial layer quality of the AlInGaN grown on sapphire substrate is superior to the other substrate material due to their thermal stability and the same crystal structure of the GaN. However, there are some disadvantages in using sapphire as a substrate material for AlInGAN-based LED device fabrication. Because the sapphire is insulator, forming an n-type bottom contact is not possible. In addition, it is very difficult to perform the post fabrication processes that include the grinding, the polishing, and the scribing since sapphire is almost as hard as diamond. However, transparent sapphire substrate is beneficial for the light extraction compare to the other non-transparent compound semiconductor material such as GaAs and InP.

Figure 1:
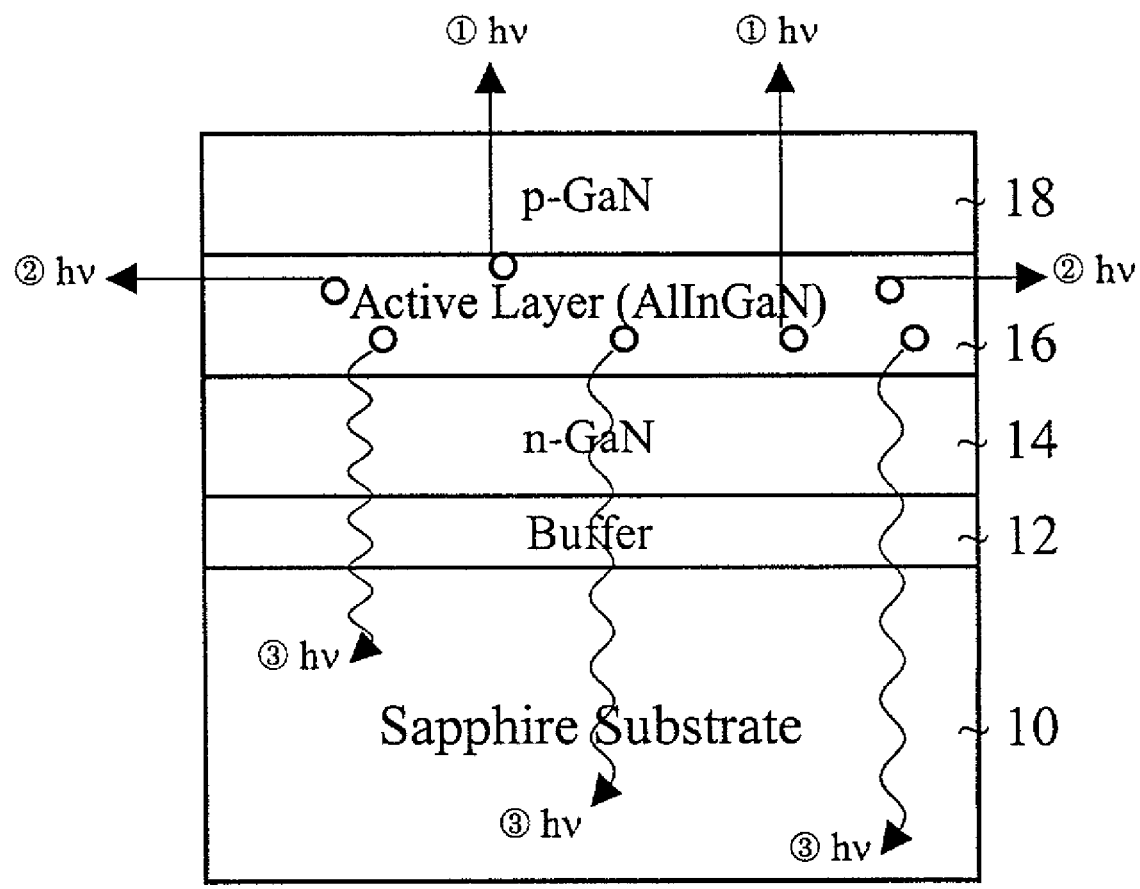
FIG. 1 generally shows a conventional light emitting diode.

Nevertheless, it has not been possible to take advantage of this important benefit. When sapphire is used for the substrate, p and n electrodes should be placed on the same top electrode position. As a result, as shown in FIG. 1, the downward photons emitted in the active region can suffer absorption by thick substrate and the lead frame. Hence, only photons directing top portion and edge emitting can contribute to the optical output power. On the other hand, if a reflecting surface is provided in the bottom sapphire substrate, in addition to the top emitting and edge emitting photons, the photons emitted to the downward direction can be reflected to the side-wall of the sapphire substrate or can be reflected back to the top surface. In addition to the backside reflective coating, the light output can be increased by making a mirror-like or highly smooth interface between the reflective metal layer and the transparent substrate. Depending on the reflective index of the substrate material and the surface conditions, including surface roughness, there is a certain angle called an escaping angle in which the photons from the active layer reflect off of the interface back to the substrate crystal. Therefore, at a fixed reflective index of the sapphire substrate, for example, the amount of reflected photons can be controlled by reducing the surface roughness of the substrate. In the present invention, a new surface polishing technique is employed in addition to the conventional mechanical polishing techniques. An atomically flat sapphire surface was obtained using an inductively coupled plasma reactive ion beam etching (ICPRIE). By using ICPRIE, the sapphire surface having a surface roughness as small as 1 nm was obtained. Moreover, the transmitted or escaped photons can be reflected back off of the smooth surface to the substrate crystal. This results in a considerable enhancement of the total optical light output of the LED device.

Figure 2A:
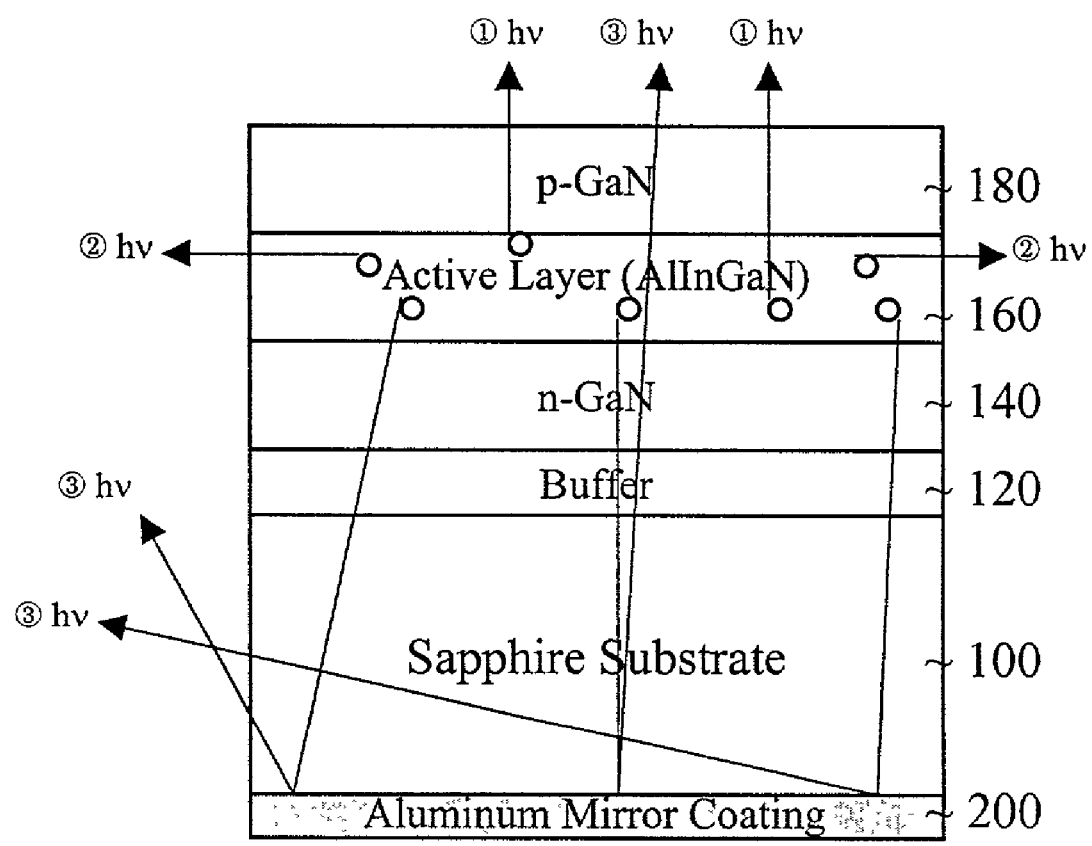
FIGS. 2A and 2B show two different embodiments of a light emitting diode of the present invention.

FIG. 2A illustrates an LED structure of the present invention. The light emitting diode structure includes substrate 100, which is a transparent substrate, such as sapphire. The sapphire has undergone backside lapping and polishing on its back surface to maximize the light output. Prior to the reflective metal coating, ICPRIE polishing was performed on a mechanically polished sapphire substrate to further reduce the surface roughness. In one sample, the ICPRIE polishing process conditions were as follows:

1600 watt RF power;

−350V substrate bias voltage;

gas mixture of 18% Cl$_2$/72% BCl$_3$/20% Ar;
20 degree Celsius substrate temperature;
40 minutes etching time; and
resulting etch rate was 350 nm/min, respectively.

Referring to FIG. 2A, a reflective layer 200 is on the sapphire substrate 100 and can be made of an aluminum mirror, for example, to reflect the photons heading toward the bottom. The reflected photons contribute to dramatically increasing the brightness of the LED. As will be discussed throughout the description, the material for the reflective layer is not limited to aluminum but may be any suitable material that will reflect the photons to increase the brightness of the LED. Moreover, the substrate of the LED may also be made of suitable materials other than sapphire.

Figure 2B:
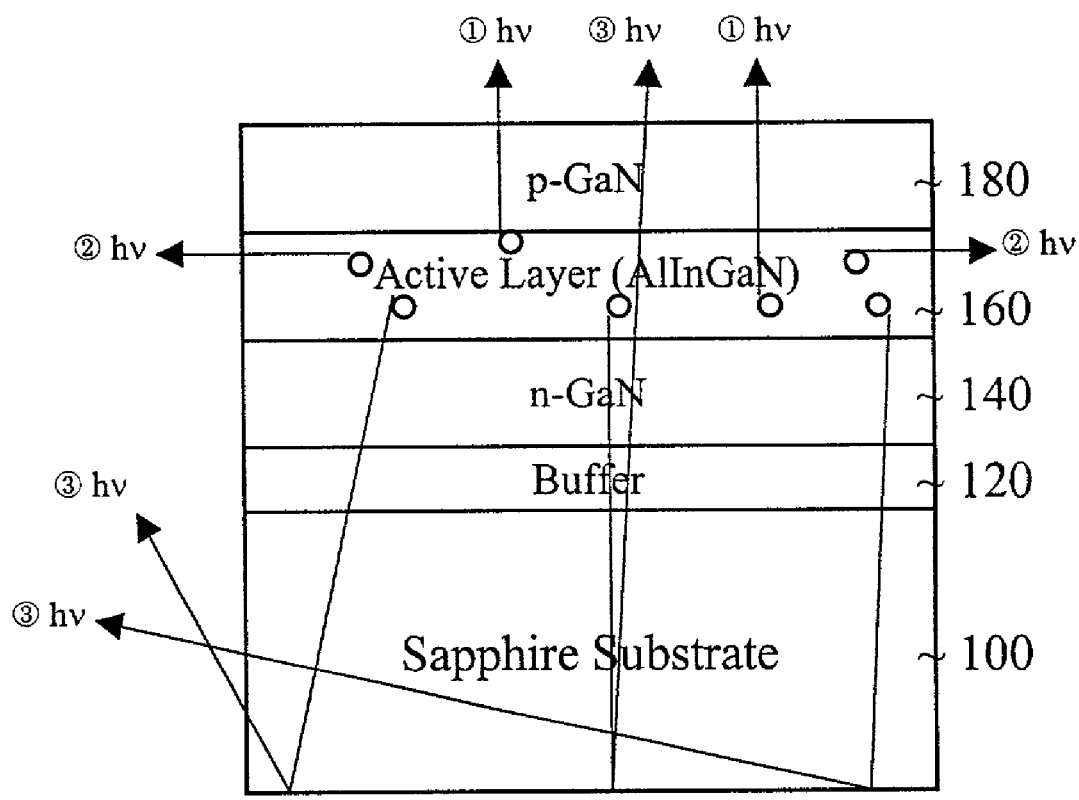

FIG. 2B illustrates another LED structure of the present invention. In FIG. 2B, the reflective layer is omitted. Although the reflective layer is omitted, the sapphire substrate 100 is polished using ICPRIE, for example, to maximize the smoothness of the surface of the surface. Such smooth surface allows the photons from the active layer directed toward the sapphire substrate to reflect off from the smooth surface of the sapphire surface to enhance the light output.

FIGS. 3A–3F illustrate the steps of making a light emitting diode, as an example application of the present invention.

Figure 3A:
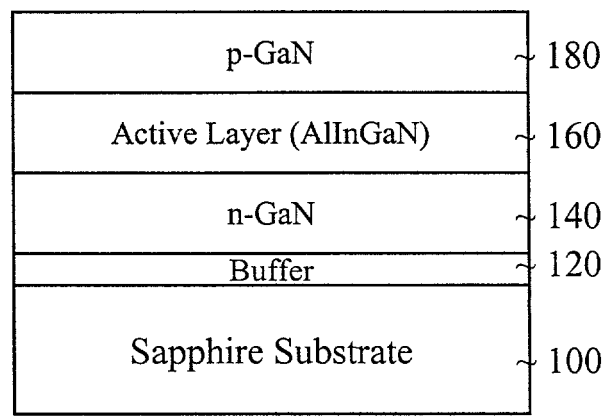
FIGS. 3A–3F shows the manufacturing steps for forming the light emitting diode of the present invention.

Referring to FIG. 3A, a buffer layer 120 is formed on a substrate 100. The substrate 100 is preferably made from a transparent material including for example, sapphire. In addition to sapphire, the substrate can be made of zinc oxide (ZnO), gallium nitride (GaN), silicon carbide (SiC) and aluminum nitride (AlN). The buffer layer 120 is made of, for example, GaN (Gallium Nitride) and, in this instance, the GaN was grown on the surface of the sapphire substrate 100. An n-type epitaxial layer such as n-GaN 140 is formed on the buffer layer 120. In this instance, the n-GaN layer 140 was doped with silicon (Si) with a doping concentration of about $10^{17}$ cm$^{-3}$ or greater. An active layer 160 such as an AlInGaN multiple quantum well layer is formed on the n-GaN layer 140. The active layer 160 may also be formed of a single quantum well layer or a double hetero structure. In this instance, the amount of indium (In) determines whether the diode becomes a green diode or a blue diode. For an LED having blue light, indium in the range of about 22% may be used. For an LED having green light, indium in the range of about 40% may be used. The amount of indium used may be varied depending on the desired wavelength of the blue or green color. Subsequently, a p-GaN layer 180 is formed on the active layer 160. In this instance, the p-GaN layer 180 was doped with magnesium (Mg) with a doping concentration of about $10^{17}$ cm$^{-3}$ or greater.

Figure 3B:
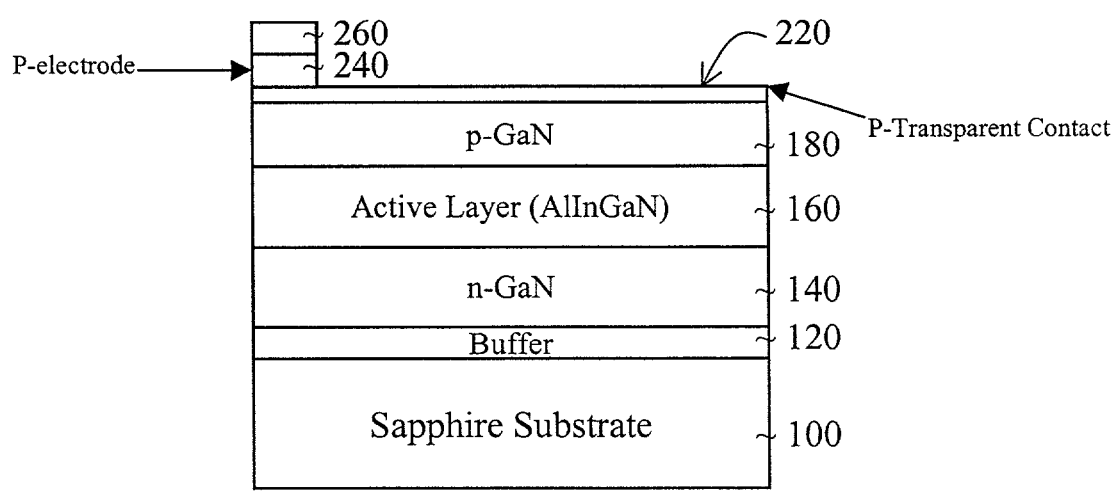

Referring to FIG. 3B, a transparent conductive layer 220 is formed on the p-GaN layer 180. The transparent conductive layer 220 may be made of any suitable material including, for example, Ni/Au or indium-tin-oxide (ITO). A p-type electrode 240 is then formed on one side of the transparent conductive layer 220. The p-type electrode 240 may be made of any suitable material including, for example, Ni/Au, Pd/Au, Pd/Ni and Pt. A pad 260 is formed on the p-type electrode 240. The pad 260 may be made of any suitable material including, for example, Au. The pad 260 may have a thickness of about 5000 Å or higher.

Figure 3C:
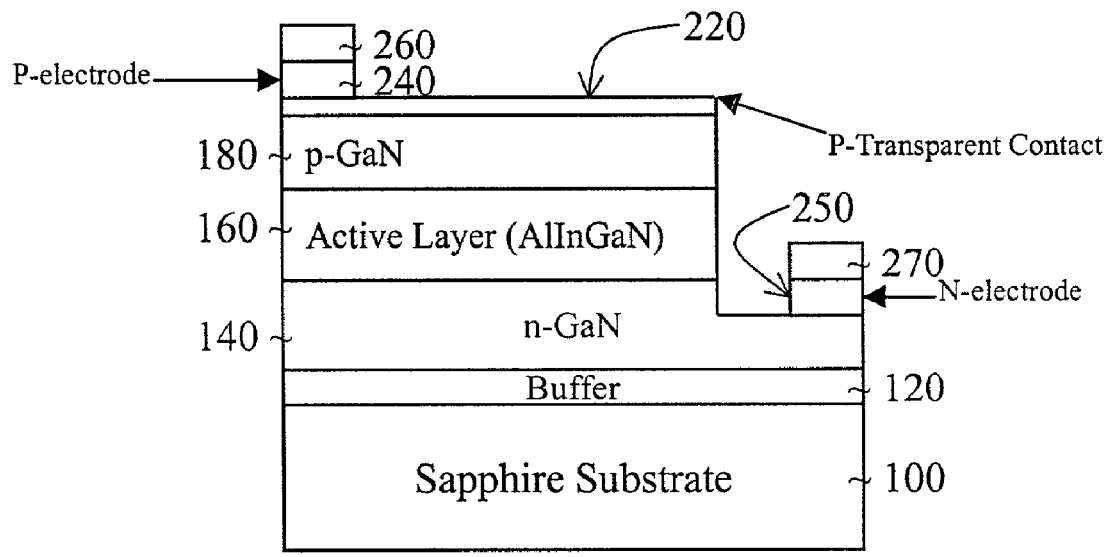

Referring to FIG. 3C, the transparent conductive layer 220, the p-GaN layer 180, the active layer 160 and the n-GaN layer 140 are all etched at one portion to form an n-electrode 250 and pad 270. As shown in FIG. 3C, the n-GaN layer 140 is etched partially so that the n-electrode 250 may be formed on the etched surface of the n-GaN layer 140. The n-electrode 250 may be made of any suitable material including, for example, Ti/Al, Cr/Au and Ti/Au. The pad 270 is a metal and may be made from the same material as the pad 260.

Figure 3D:
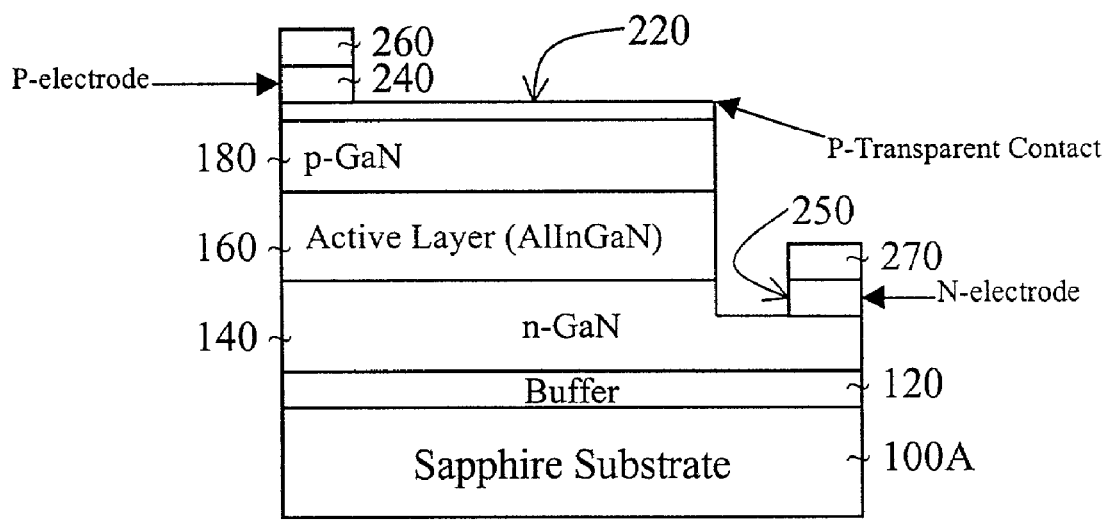

Referring to FIG. 3D, the thickness of the substrate 100, such as made from sapphire, is reduced to form a thinner substrate 100A. In this regard, backside lapping is performed on the sapphire substrate 100 to reduce the wafer thickness. After backside lapping, mechanical polishing is performed to obtain an optically flat surface. After mechanical polishing, the surface roughness (Ra) may be less than about 15 nm. Such polishing technique can reduce the surface roughness up to about 5 nm or slightly less. Such low surface roughness adds to the reflective property of the surface.

In the present invention, the thickness of the substrate 100 can be controlled to be in the range of, for example, 350–430 µm. Moreover, the thickness can be reduced to less than 350 µm and to less than 120 µm. Here, mechanical polishing and dry etching techniques are used. For dry etching, inductively coupled plasma (ICP) reactive ion beam etching (RIE) may be used as an example.

Figure 3E:
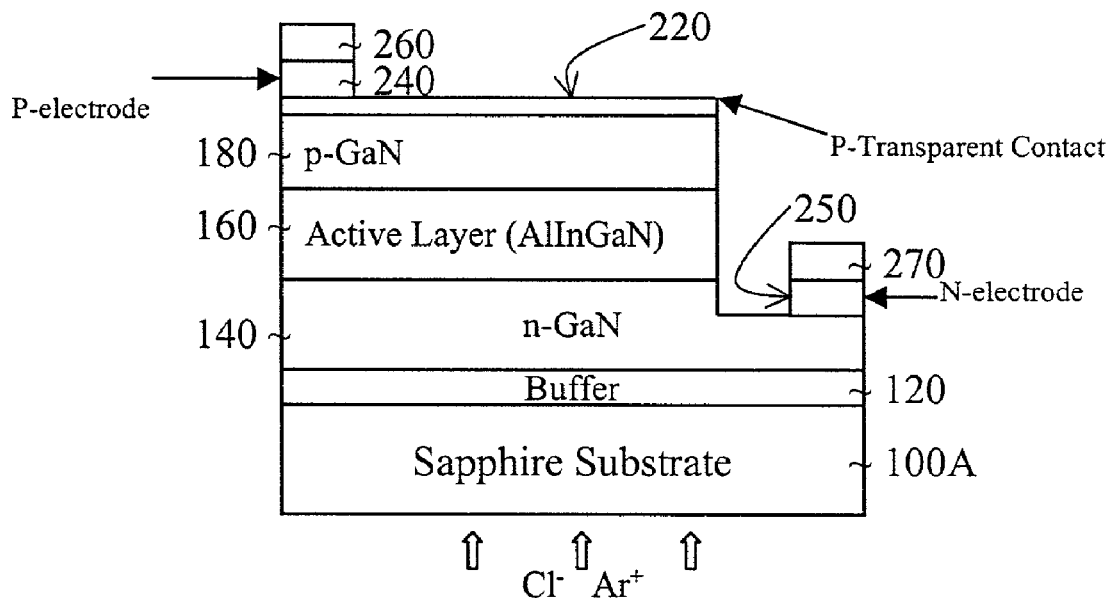

Referring to FIG. 3E, the surface roughness is further reduced to obtain a surface roughness of less than 1 nm. The surface roughness can be reduced from 5 nm up to less than 1 nm by using dry etching. One such dry etching technique is inductively coupled plasma (ICP) reactive ion beam etching (RIE) to obtain an atomically flat surface. The maximum reduction of the surface roughness further enhances the reflectivity of the surface. It is noted that depending on the type of material used for the substrate 100, the surface roughness may be further reduced for maximum reflectivity of the surface.

Figure 3F:
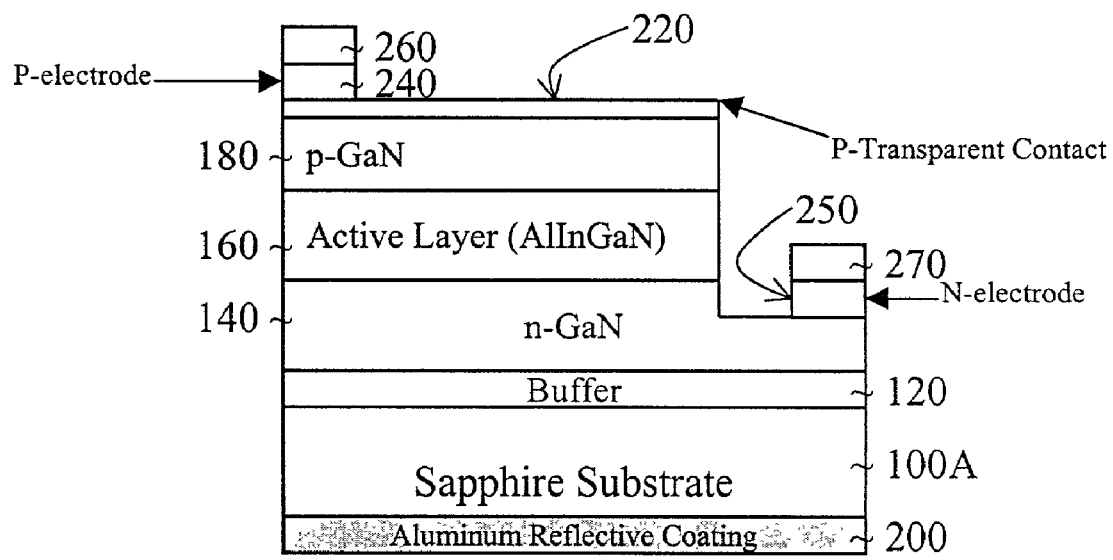

Referring to FIG. 3F, on the polished thin substrate 100A, a reflective material 200 is formed. The reflective material 200 can be any suitable material that can reflect light. In the present example, an aluminum coating of about 300 nm thick was formed on the polished sapphire surface 100A using an electron beam evaporation technique. Of course, other suitable deposition techniques may be used and different thicknesses of the aluminum are contemplated in the present invention. Here, the aluminum may have a concentration of about 99.999% or higher, which allows the aluminum to have a mirror-like property with maximum light reflectivity. Moreover, the reflective layer 200 entirely covers the second side of the substrate 100A.

Figure 5:
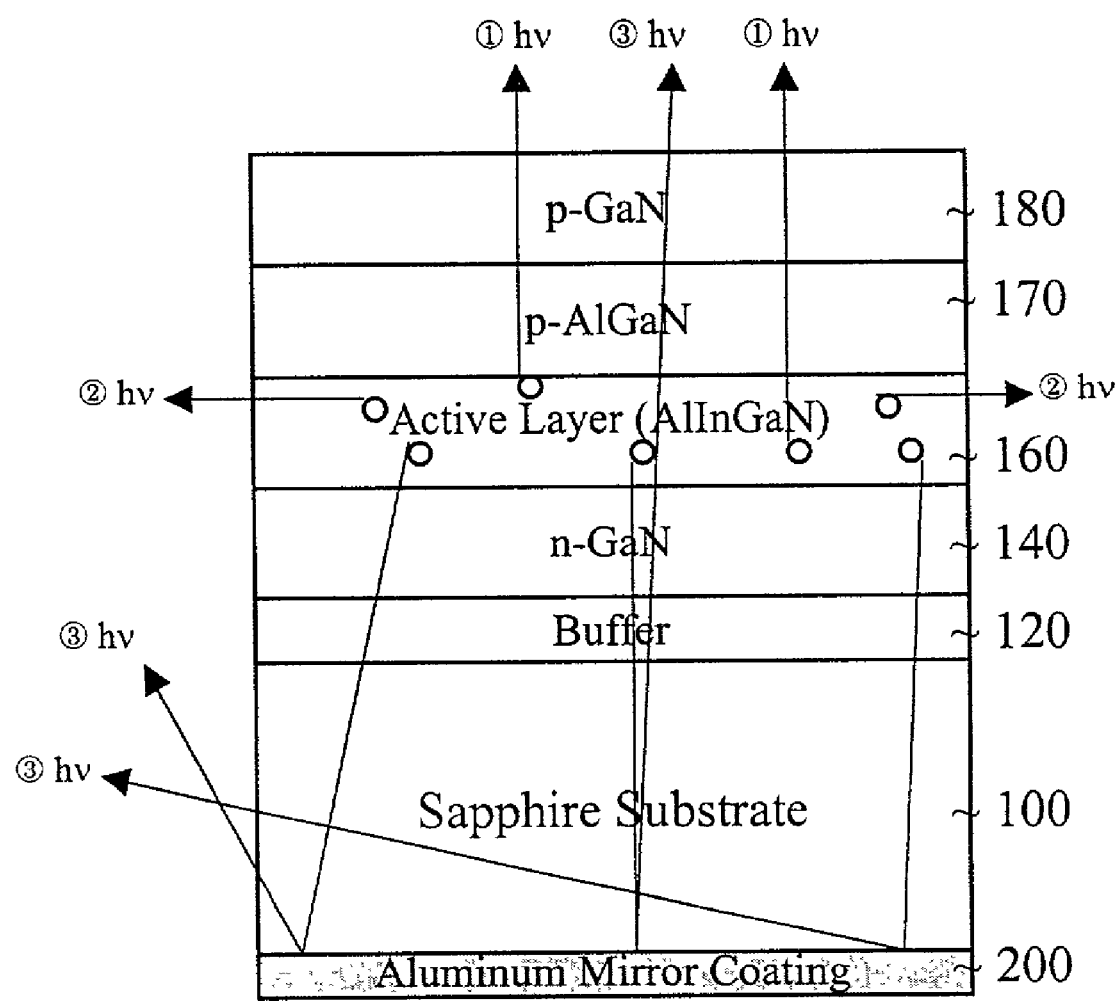
FIG. 5 shows another embodiment of the diode of the present invention.

FIG. 5 shows an alternative embodiment in which a cladding layer 170 is formed between the p-GaN layer 180 and the active layer 160. The cladding layer 170 is preferably formed with p-AlGaN. The cladding layer 170 enhances the performance of the diode. For simplicity, FIG. 5 does not show the p-electrode, n-electrode and the pads.

As conceptually shown in FIGS. 2A and 2B, the photons generated in the active layer which head toward the polished sapphire surface and the aluminum mirror coating 200 are reflected. Such reflected photons add to the brightness of the diode (photon recovery). Adding the reflective layer and making atomically flat surface greatly increases the brightness of the diode. In addition to the reflective surface of the reflective layer 200, it is important to note that the low surface roughness of the substrate 100 also enhances the photon reflection.

FIG. 6 is a graph showing a relationship between the light output and the injection current of, for example, a light emitting diode (LED). One curve of the graph depicts an LED having a reflective layer (in this case, an aluminum)

and the other curve depicts an LED without a reflective layer. In this graph, only mechanical polishing was performed on both LED's. When the reflective aluminum layer was added to the mechanically polished surface of the sapphire substrate, the light output increased about 200% as compared to the device without the reflective layer.

Figure 4:
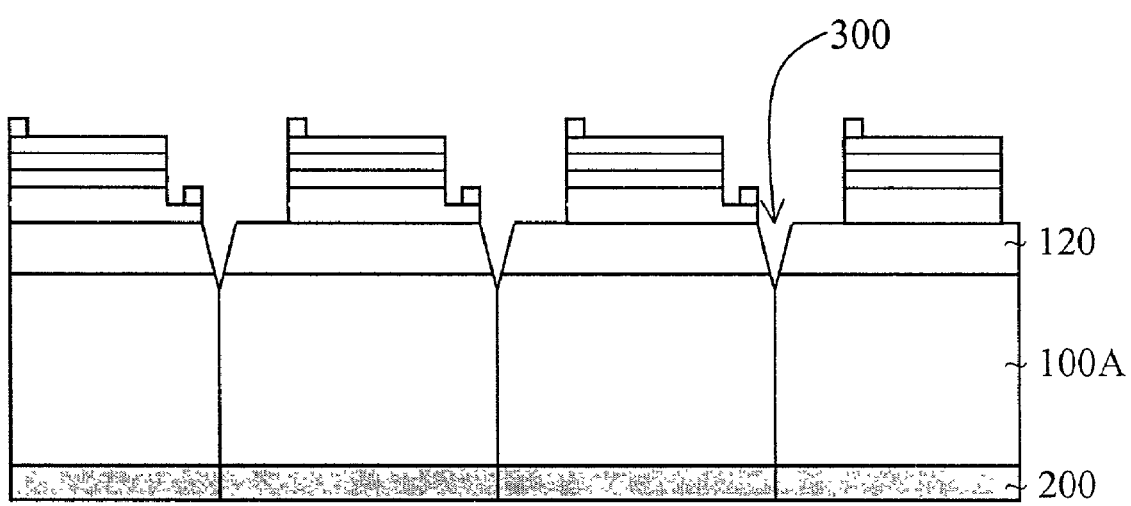
FIGS. 4A and 4B each show a wafer having the light emitting diodes with scribe lines.

FIG. 4A shows a wafer having LEDs formed thereon. Scribe lines 300 are formed on the wafer through the buffer layer 120 from the side having the LEDs (front scribing) to separate the LED chips. The scribe lines 300 are formed using, for example, a dry etching technique or mechanical scribing. The dry etching technique such as inductively coupled plasma (ICP) reactive ion beam etching (RIE) can form very narrow scribe lines on the buffer layer 120 and the substrate 100A. Using such dry etching technique greatly increased the number of LED chips on the wafer because the space between the chips can be made very small. For example, the space between the diode chips can be as narrow as 10 µm or lower. FIG. 4B is an alternative method of forming the scribe lines in which the back side of the diode used.

The scribe lines may also be formed by a diamond stylus, which requires a large spacing between the diode chips due to the size of the diamond stylus itself. Also, a dicing technique may be used to separate the chips.

Once the diode chips are separated, each diode may be packaged. Such package may also be coated with a reflective material to further enhance the light output.

The present invention applies a simple and inexpensive light extraction process to the existing device fabrication process. According to this invention, adding just one more step of metallization after backside lapping and polishing allows a significant light output increase. With finer polishing using dry etching, in some cases, the light output can be as much as a factor of four without a substantial increase in production cost.

The diode of the present invention improves light intensity of a diode such as an AlInGaN-based light emitting diode (LED) using a reflective coating. The reflective coating recovers those photons, which would otherwise be absorbed by the substrate or the lead frame in the LED package. This increases the total external quantum efficiency of the quantum well devices. This invention can be applied not only to the current commercially available blue, green, red and white LEDs but also to other LED devices. Using this technique, the light output was increased by as much as a factor of four as compared to conventional LED devices (without the reflective coating) without significantly sacrificing or changing other characteristics of the diode.

Although the present invention has been described in detail with reference to GaN technology diodes, the reflector and substrate polishing technique of the present invention can easily be applied to other types of diodes including red LEDs and laser diodes including VCSELs. Although red LEDs do not use GaN, the substrate of the red LEDs may just as easily be polished and a reflective layer can easily be attached to the polished surface of the substrate, as described above. Such technique also recovers the photons to increase the light output of the diode. Similar technique is also applicable for laser diodes.

It will be apparent to those skilled in the art that various modifications and variation can be made in the present invention without departing from the split or scope of the invention. Thus, it is intended that the present invention cover the modifications and variations of this invention provided they come within the scope of the appended claims and their equivalents.

What is claimed is:

1. A light emitting diode comprising:
   a transparent substrate;
   a buffer layer on a first surface of the transparent substrate;
   an n-GaN layer on the buffer layer;
   an active layer on the n-GaN layer;
   a p-GaN layer on the active layer;
   a p-electrode on the p-GaN layer;
   a p-transparent contact between the p-electrode and the p-GaN layer, wherein the p-transparent contact includes indium-tin-oxide;
   an n-electrode on the n-GaN layer; and
   a reflective layer on a second side of the transparent substrate.

2. The light emitting diode according to claim 1, wherein the second side of the transparent substrate has a polished surface.

3. The light emitting diode according to claim 1, wherein the second side of the transparent substrate has been polished by mechanical polishing.

4. The light emitting diode according to claim 1, wherein the second side of the transparent substrate has been polished by dry etching.

5. The light emitting diode according to claim 1, wherein the second side of the transparent substrate has been polished by mechanical polishing and dry etching.

6. The light emitting diode according to claim 1, wherein the second side of the transparent substrate has undergone back lapping.

7. The light emitting diode according to claim 1, wherein the second side of the transparent substrate has undergone back lapping and is polished by mechanical polishing.

8. The light emitting diode according to claim 1, wherein the reflective layer includes aluminum.

9. The light emitting diode according to claim 1, wherein the reflective layer includes a metal selected from the group consisting of aluminum, gold, palladium, titanium, indium, nickel and platinum.

10. The light emitting diode according to claim 9, wherein the reflective layer includes aluminum having a concentration of about 99.999% or higher.

11. The light emitting diode according to claim 1, wherein the reflective layer includes aluminum of about 3000 Å.

12. The light emitting diode according to claim 1, wherein the reflective layer substantially entirely covers the second side of the substrate.

13. The light emitting diode according to claim 1, wherein the transparent substrate further comprises a buffer layer including GaN.

14. The light emitting diode according to claim 1, wherein the transparent substrate further comprises a buffer layer including aluminum nitride (AlN).

15. The light emitting diode according to claim 1, wherein the transparent substrate includes a material selected from the group consisting of sapphire, zinc oxide (ZnO), gallium nitride (GaN), silicon carbide (SiC) and aluminum nitride (AlN).

16. The light emitting diode according to claim 1, wherein the transparent substrate includes sapphire.

17. The light emitting diode according to claim 16, wherein the transparent substrate has a thickness of 350–430 µm.

18. The light emitting diode according to claim 16, wherein the transparent substrate has a thickness of less than 350 µm.

19. The light emitting diode according to claim 16, wherein the transparent substrate has a thickness of less than 120 μm.

20. The light emitting diode according to claim 16, wherein the transparent substrate has a thickness between about 100 μm to 120 μm.

21. the light emitting diode according to claim 1, further comprising a metal pad on the p-electrode and the n-electrode.

22. The light emitting diode according to claim 22, wherein the metal pad is about 5000 Å or higher.

23. The light emitting diode according to claim 22, wherein the metal pad includes Au.

24. The light emitting diode according to claim 1, wherein the n-electrode includes Ti and Al (Ti/Al).

25. The light emitting diode according to claim 1, wherein the n-electrode includes a material selected from the group consisting of Ti/Al, Cr/Au and Ti/Au.

26. The light emitting diode according to claim 1, wherein the p-electrode includes Ni and Au (Ni/Au).

27. The light emitting diode according to claim 1, wherein the p-electrode includes a material selected from the group consisting of Ni/Au, Pd/Au, Pd/Ni and Pt.

28. The light emitting diode according to claim 1, wherein the active layer includes AlInGaN.

29. The light emitting diode according to claim 1, wherein the second surface of the transparent substrate has an average surface roughness of less than 15 nm.

30. The light emitting diode according to claim 1, wherein the second surface of the transparent substrate has an average surface roughness of less than 6 nm.

31. The light emitting diode according to claim 1, wherein the second surface of the transparent substrate has an average surface roughness of less than 2 nm.

32. The light emitting diode according to claim 1, wherein the second surface of the transparent substrate has an average surface roughness of less than 1 nm.

33. The light emitting diode according to claim 1, further comprising a package housing the light emitting diode.

34. The light emitting diode according to claim 1, wherein the reflective layer is directly on the second side of the transparent substrate.

35. The light emitting diode according to claim 1, wherein the active layer includes at least one of a quantum well layer and a double hetero structure.

36. The light emitting diode according to claim 1, wherein the quantum layer includes a multiple quantum layer.

* * * * *